(12) United States Patent
Yung et al.

(10) Patent No.: US 12,320,847 B2
(45) Date of Patent: Jun. 3, 2025

(54) TEST DEVICE FOR TESTING ON-CHIP CLOCK CONTROLLER HAVING DEBUG FUNCTION

(71) Applicant: REALTEK SEMICONDUCTOR CORPORATION, Hsinchu (TW)

(72) Inventors: Sheng-Ping Yung, Hsinchu (TW); Pei-Ying Hsueh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 18/379,686

(22) Filed: Oct. 13, 2023

(65) Prior Publication Data

US 2024/0133950 A1   Apr. 25, 2024
US 2024/0230757 A9   Jul. 11, 2024

(30) Foreign Application Priority Data

Oct. 25, 2022   (TW) .................................. 111140526

(51) Int. Cl.
  *G01R 31/317* (2006.01)
  *G01R 31/3185* (2006.01)
(52) U.S. Cl.
  CPC ............ *G01R 31/31727* (2013.01); *G01R 31/318552* (2013.01)
(58) Field of Classification Search
  CPC ............ G01R 31/31727; G01R 31/318552
  See application file for complete search history.

(56) References Cited

U.S. PATENT DOCUMENTS

| | | | |
|---|---|---|---|
| 10,605,861 B2 | 3/2020 | Chen et al. | |
| 2015/0323594 A1* | 11/2015 | Khullar | G01R 31/31704 714/727 |
| 2016/0349318 A1* | 12/2016 | Pereira | G01R 31/318552 |
| 2019/0120901 A1* | 4/2019 | Chen | G01R 31/31705 |
| 2023/0349971 A1* | 11/2023 | Kuo | G01R 31/31726 |

FOREIGN PATENT DOCUMENTS

TW    I650566    2/2019

* cited by examiner

*Primary Examiner* — Cynthia Britt
(74) *Attorney, Agent, or Firm* — WPAT, PC

(57) ABSTRACT

A test device is configured to test an on-chip clock controller having a debug function. The test device includes a scan chain and a test circuit. The scan chain includes N flip-flop circuit(s), each of which stores a first input signal as a storage signal, then stores a second input signal as the storage signal or keeps the current storage signal according to an input clock, and then output the storage signal. Since the first and second input signals are different, the outputted storage signal indicates whether the flip-flop circuit stores the second input signal or keeps the current storage signal according to the input clock under predetermined test setting, and indicates whether circuits under test (CUTs) for transmitting the input clock operate normally. The test circuit outputs an observation clock of the on-chip clock controller or an independent clock as the input clock according to the predetermined test setting.

10 Claims, 15 Drawing Sheets

TEST DEVICE FOR TESTING ON-CHIP CLOCK CONTROLLER HAVING DEBUG FUNCTION

BACKGROUND OF THE INVENTION

1. Field of the Invention

The present disclosure relates to a test device, especially to a test device designed to test an on-chip clock controller.

2. Description of Related Art

Applicant's US patent (U.S. Pat. No. 10,605,861 B2) discloses a test device designed to test an integrated circuit. However, if the test device itself functions abnormally (e.g., the test device forces its on-chip clock controller to output a low-speed clock exclusively for a debug function due to wrong setting, problematic design, or manufacturing defects), a product including the test device may cause an RMA (return merchandise authorization).

SUMMARY OF THE INVENTION

An object of the present disclosure is to provide a test device designed to test an on-chip clock controller having a debug function and to prevent the problems of the prior art.

An embodiment of the test device of the present disclosure is designed to test an on-chip clock controller. This embodiment includes a scan chain and a test circuit. The scan chain includes N flip-flop circuit(s), wherein the N is a positive integer. A $K^{th}$ flip-flop circuit of the N flip-flop circuit(s) includes a $K^{th}$ input switch and a $K^{th}$ flip-flop, wherein the K is a positive integer not greater than the N. The $K^{th}$ input switch is configured to output one of a first input signal and a second input signal as an input signal according to a scan enable (SEN) signal. The $K^{th}$ flip-flop is configured to store the input signal and output a stored signal as a $K^{th}$ output signal according to an input clock, wherein the stored signal is one of the first input signal and the second input signal. The test circuit includes N selective circuit(s). The N selective circuit(s) is/are coupled with the N flip-flop circuit(s) respectively, wherein a $K^{th}$ selective circuit of the N selective circuit(s) is corresponding to the $K^{th}$ flip-flop circuit. The $K^{th}$ selective circuit includes: a $K^{th}$ clock switch configured to output one of a $K^{th}$ observation clock and an independent clock as the input clock for the $K^{th}$ flip-flop according to a selection signal, wherein in a debug circuit test mode, the selection signal is determined according to the SEN signal and the $K^{th}$ observation clock is from a $K^{th}$ on-chip clocking circuit (OCC) of the on-chip clock controller. Based on the above, the $K^{th}$ input switch outputs the first input signal according to a first signal value of the SEN signal first to let the $K^{th}$ flip-flop store the first input signal according to the input clock while a value of the first input signal is a first input value; then the $K^{th}$ input switch outputs the second input signal according to a second signal value of the SEN signal, and the $K^{th}$ flip-flop replaces the first input signal with the second input signal or keeps the first input signal according to the input clock while a value of the second input signal is a second input value that is different from the first input value; and then a value of the $K^{th}$ output signal (i.e., one of the first input value and the second input value) of the $K^{th}$ flip-flop indicates whether the input clock successfully triggers the $K^{th}$ flip-flop under test setting and thereby shows whether circuit(s) under test (CUT(s)) for transmission of the input clock function(s) normally under the test setting.

Another embodiment of the test device of the present disclosure is designed to test an on-chip clock controller. This embodiment includes a scan chain and a test circuit. The scan chain includes N flip-flop circuit(s), wherein the N is a positive integer. Each of the N flip-flop circuit(s) is a target flip-flop circuit. The target flip-flop circuit is configured to: store a first input signal as a storage signal first, then store a second input signal as the storage signal according to an input clock or keep the first input signal as the storage signal according to the input clock, and then output the storage signal. Since a value of the first input signal is different from a value of the second input signal, the value of the storage signal indicates whether the target flip-flop circuit stores the second input signal or keeps the first input signal according to the input clock under test setting and thereby shows whether circuit(s) under test (CUT(s)) for the transmission of the input clock function(s) normally under the test setting. The test circuit includes N selective circuit(s), wherein: the N selective circuit(s) is/are corresponding to the N flip-flop circuit(s) respectively; each of the N selective circuit(s) is a target selective circuit; the target selective circuit is configured to output one of an observation clock and an independent clock as the input clock according to the test setting, and thereby output the input clock to one of the N flip-flip circuit(s) that is corresponding to the target selective circuit; and the observation clock is from the on-chip clock controller.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a test device. The test device can test an on-chip clock controller having a debug function to determine whether the debug function is problematic. However, even though the on-chip clock controller does not have the debug function, the test device of the present disclosure can test the on-chip clock controller to determine whether the on-chip clock controller transmits a clock as expected.

Figure 1:
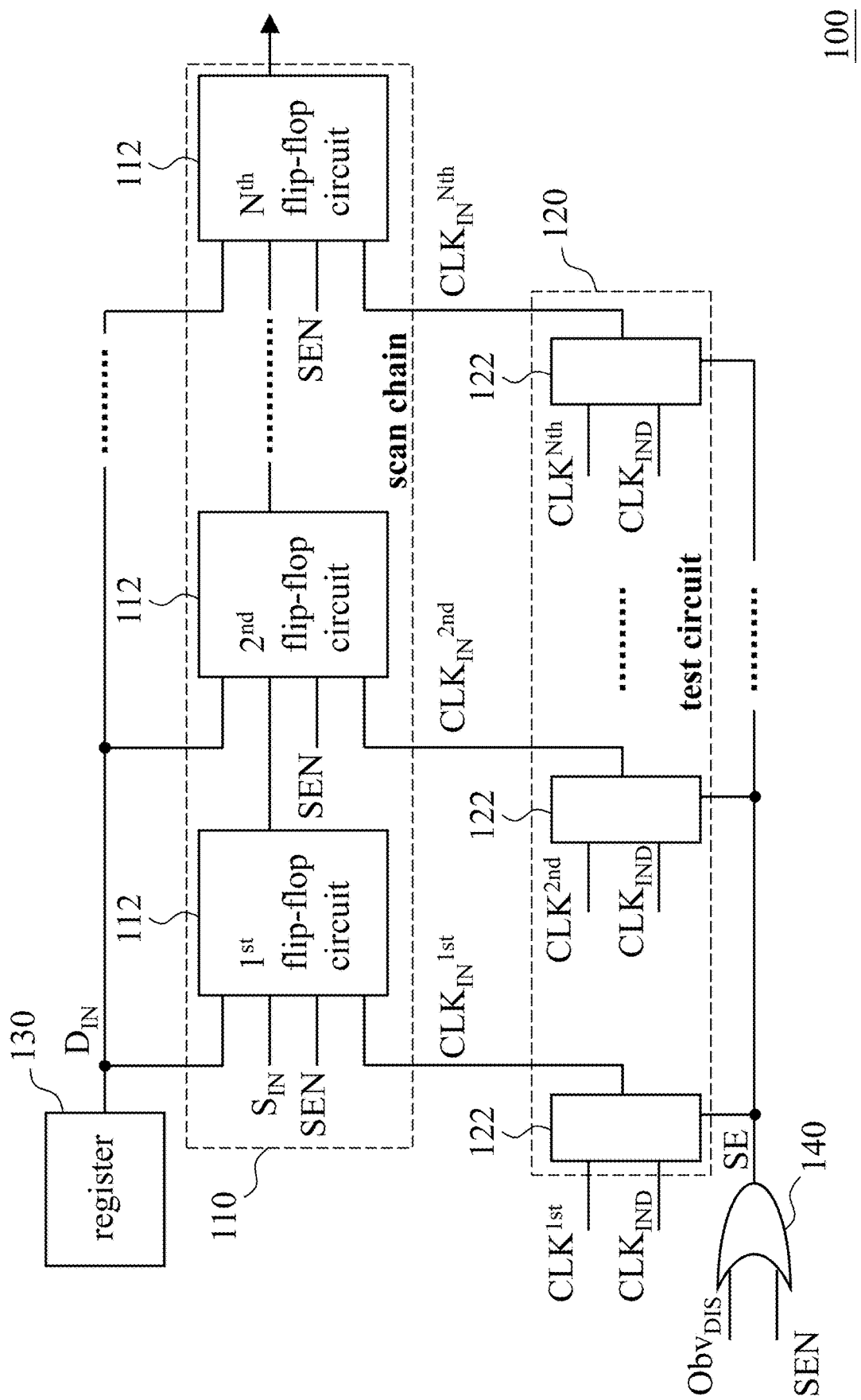
FIG. 1 shows an embodiment of the test device of the present disclosure.

FIG. 1 shows an embodiment of the test device of the present disclosure. The test device 100 of FIG. 1 is configured to test an on-chip clock controller. An embodiment of the on-chip clock controller is found in Applicant's US patent (U.S. Pat. No. 10,605,861 B2) and its detail is omitted here. The test device 100 includes a scan chain 110, a test circuit 120, a register 130, and an OR gate 140, and the test device 100 optionally includes the on-chip clock controller. In an alternative embodiment, the register 130 is set outside the test device 100. In an alternative embodiment, the OR gate 140 is omitted.

Referring to FIG. 1, the scan chain 110 includes N flip-flop circuit(s) 112, wherein the N is a positive integer. When the N is greater than one, the N flip-flop circuits 112 (i.e., a $1^{st}$ flip-flop circuit 112, a $2^{nd}$ flip-flop circuit 112, . . . , and an $N^{th}$ flip-flop circuit 112) are cascaded, and thus the output of an $X^{th}$ flip-flop Circuit 112 is the input of an $(X+1)^{th}$ flip-flop circuit 112, wherein the X is a positive integer smaller than the N. Each flip-flop circuit 112 (hereinafter referred to as the $K^{th}$ flip-flop circuit 112, wherein the K is a positive integer not greater than the N and a $K^{th}$ input clock for the $K^{th}$ flip-flop circuit is $CLK_{IN}^{Kth}$) is configured to perform the following operations:

a loading operation: storing a first input signal $S_{IN}$ (hereinafter referred to as "$S_{IN}$") as a storage signal according to an input clock $CLK_{IN}^{Kth}$ (hereinafter referred to as "$CLK_{IN}^{Kth}$") while the frequency of $CLK_{IN}^{Kth}$ (hereinafter referred to as "$f_{CLK\_IN}$") is greater than zero. It is noted that $S_{IN}$ is a controllable signal. It is also noted that the output of an $X^{th}$ flip-flop circuit 112 acts as $S_{IN}$ for an $(X+1)^{th}$ flip-flop circuit 112.

a test operation: storing a second input signal $D_{IN}$ (hereinafter referred to as "$D_{IN}$") as the storage signal according to $CLK_{IN}$, or keeping $S_{IN}$ as the storage signal according to $CLK_{IN}^{Kth}$.

In this case, $f_{CLK\_IN}$ is greater than zero to make the $K^{th}$ flip-flop circuit 112 store $D_{IN}$ or $f_{CLK\_IN}$ is equal to zero to make the $K^{th}$ flip-flop circuit 112 keep $S_{IN}$, which depends on test setting. It is noted that the value of $S_{IN}$ (e.g., 0) is different from the value of $D_{IN}$ (e.g., 1). It is also noted that in this specification the meaning of "a signal, or the value thereof, is 1 or 0" means that the signal or the value thereof is deemed 1 or 0 by the circuit receiving the signal, wherein the form of the signal such as the bit number of the signal can be determined according to the demand for implementation.

A decision operation: outputting the storage signal as a $K^{th}$ output signal.

If $f_{CLK\_IN}$ is supposed to be greater than zero during the test operation under the test setting but the $K^{th}$ output signal is $S_{IN}$, this shows one or more circuit(s) under test (hereinafter referred to as "CUT(s)") for the transmission of $CLK_{IN}^{Kth}$ functions abnormally. Similarly, if $f_{CLK\_IN}$ is supposed to be zero during the test operation under the test setting but the $K^{th}$ output signal is $D_{IN}$, this shows the CUT(s) for the transmission of $CLK_{IN}^{Kth}$ functions abnormally.

It is noted that the N flip-flop circuit(s) can be reset (not shown in the figures) when needed, but this is beyond the scope of the present disclosure.

Referring to FIG. 1, the test circuit 120 includes N selective circuit(s) 122 which is/are coupled to the N flip-flop circuit(s) 112 in a predetermined manner (e.g., one-to-one manner). Each of the N selective circuit(s) 122 (hereinafter referred to as "$K^{th}$ selective circuit 122") is configured to output one of a $K^{th}$ observation clock $CLK^{Kth}$ (hereinafter referred to as "$CLK^{Kth}$") and an independent clock $CLK_{IND}$ (hereinafter referred to as "$CLK_{IND}$") based on the aforementioned test setting, wherein when the K is 1, 2, . . . , or N, $CLK^{Kth}$ denotes $CLK^{1st}$, $CLK^{2nd}$, . . . , or $CLK^{Nth}$, $CLK^{Kth}$ is from a $K^{th}$ on-chip clocking circuit ($K^{th}$ OCC) of the aforementioned on-chip clock controller, and $CLK_{IND}$ is independent of $CLK^{Kth}$. To be more specific, under the test setting: provided the frequency of $CLK^{Kth}$ (hereinafter referred to as "$f_{CLK}^{Kth}$") is supposed to be greater than zero to make the $K^{th}$ flip-flop circuit 112 store $D_{IN}$, the frequency of $CLK_{IND}$ (hereinafter referred to as "$f_{CLK\_IND}$") is zero, and the $K^{th}$ selective circuit 122 is supposed to output $CLK^{Kth}$ as $CLK_{IN}^{Kth}$ during the aforementioned test operation, when the aforementioned $K^{th}$ output signal is $S_{IN}$, it means that the CUT(s) of the $K^{th}$ OCC for the transmission of $CLK^{Kth}$ functions abnormally or the $K^{th}$ selective circuit 122 functions abnormally so that an unexpected clock having a frequency equal to zero is outputted as $CLK_{IN}^{Kth}$. Similarly, under the test setting: provided $f_{CLK}^{Kth}$ is supposed to be zero to make the $K^{th}$ flip-flop circuit 112 keep $S_{IN}$, $f_{CLK\_IND}$ is zero, and the $K^{th}$ selective circuit 122 is supposed to output $CLK^{Kth}$ as $CLK_{IN}^{Kth}$ during the test operation, when the $K^{th}$ output signal is $D_{IN}$, it means that the CUT(s) of the $K^{th}$ OCC for the transmission of $CLK^{Kth}$ functions abnormally so that an unexpected clock having a frequency greater than zero is outputted as $CLK_{IN}^{Kth}$.

Referring to FIG. 1, the register 130 is a known/self-developed register and used for providing $D_{IN}$.

Referring to FIG. 1, the OR gate 140 is a known/self-developed OR gate. The OR gate 140 is used for receiving an observation disable signal $Obv_{DIS}$ (hereinafter referred to as "$Obv_{DIS}$") and a scan enable signal SEN (hereinafter referred to as "SEN") and accordingly outputting a selection signal SE. To be more specific, when any of $Obv_{DIS}$ and SEN is 1, the selection signal is 1. The selection signal SE is used for requesting the $K^{th}$ selective circuit 122 to output $CLK^{Kth}$ when the value of SE is a first value (e.g., 0), and used for requesting the $K^{th}$ selective circuit 122 to output $CLK_{IND}$ when the value of SE is a second value (e.g., 1).

On the basis of the above description, the test device 100 of FIG. 1 can operate in a debug circuit test mode and can optionally operate in a normal test mode. The debug circuit test mode is for determining whether the CUT(s) of the aforementioned on-chip clock controller and the CUT(s) of the test circuit 120 function normally. The normal test mode is for determining whether the OR gate 140 and the CUT(s) of the test circuit 120 function normally. In the debug circuit test mode, in order to make the $K^{th}$ selective circuit 122 selectively output $CLK^{Kth}$ or $CLK_{IND}$ according to the output of the OR gate 140 (i.e., the selection signal SE), $Obv_{DIS}$ should be set properly (e.g., $Obv_{DIS}=0$) to avoid restricting the output of the OR gate 140; in the meantime, the output of the OR gate 140 is dependent on SEN, which means that the selection signal SE is equivalent to SEN, wherein the value of SEN can be a first signal value (e.g., SEN=1 during the aforementioned loading operation and decision operation) or a second signal value (e.g., SEN=0 during the aforementioned test operation). In the normal test mode, in order to make the $K^{th}$ selective circuit 122 output $CLK_{IND}$ instead of $CLK^{Kth}$, $Obv_{DIS}$ should be set properly (e.g., $Obv_{DIS}=1$) to force the selection signal SE (e.g., SE=$Obv_{DIS}=1$) to request the $K^{th}$ selective circuit 122 to output $CLK_{IND}$.

Figure 2:
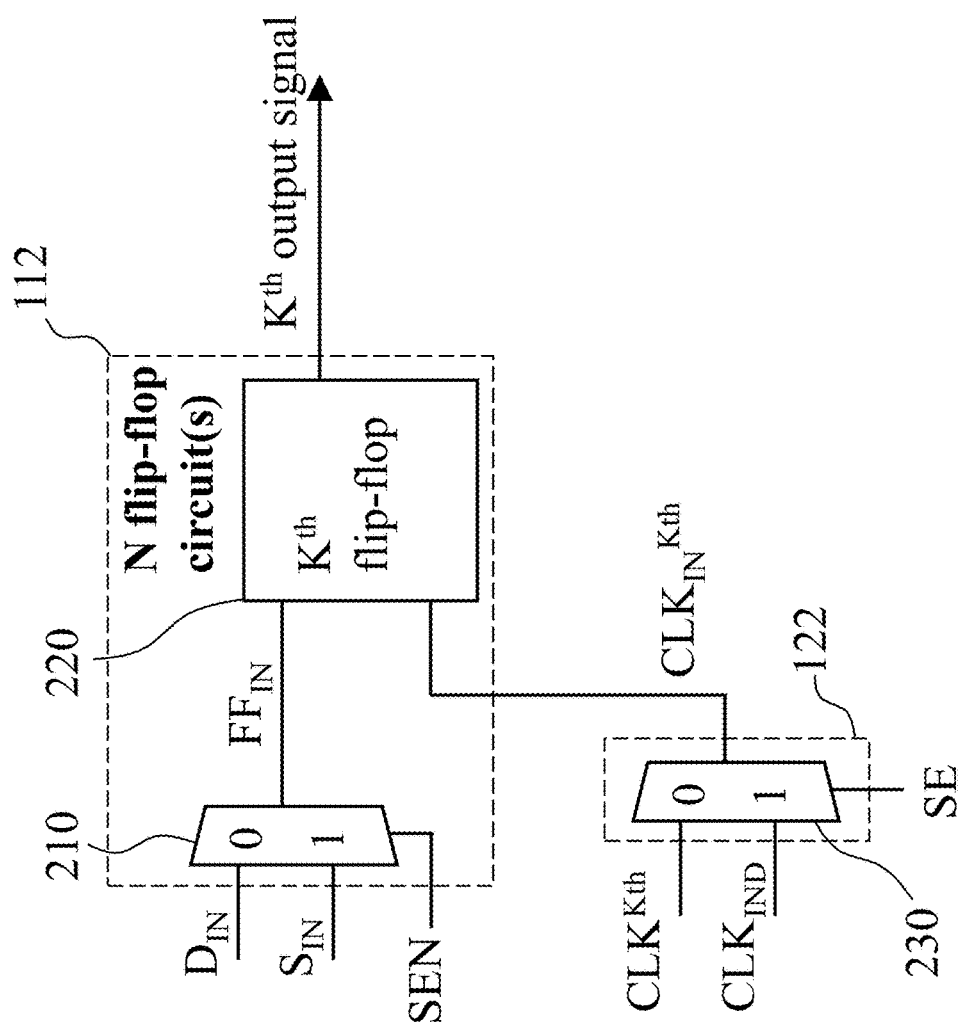
FIG. 2 shows an embodiment of the $K^{th}$ flip-flop circuit and the $K^{th}$ selective circuit of FIG. 1.

FIG. 2 shows an embodiment of the $K^{th}$ flip-flop circuit 112 and the $K^{th}$ selective circuit 122. As shown in FIG. 2: the $K^{th}$ flip-flop circuit 112 includes a $K^{th}$ input switch 210 (e.g., a multiplexer) and a $K^{th}$ flip-flop 220 (e.g., a D flip-flop (DFF)); and the $K^{th}$ selective circuit 122 includes a $K^{th}$ clock switch 230 (e.g., a multiplexer). The $K^{th}$ input switch 210 is configured to output a flip-flop input signal $FF_{IN}$ (hereinafter referred to as "$FF_{IN}$") to the $K^{th}$ flip-flop 220 according to the SEN, wherein $FF_{IN}$ is one of the aforementioned $S_{IN}$ and $D_{IN}$. The $K^{th}$ clock switch 230 is configured to output $CLK_{IN}^{Kth}$ to the $K^{th}$ flip-flop 220 according to the selection signal SE, wherein $CLK_{IN}^{Kth}$ is $CLK^{Kth}$ when the value of SE is a first value (e.g., 0) or $CLK_{IN}^{Kth}$ is $CLK_{IND}$ when the value of SE is a second value (e.g., 1).

It is noted that the test device 100 of FIG. 1 may include the aforementioned on-chip clock controller. The on-chip clock controller may include N on-chip clocking circuit(s) (OCC(s)) to be tested by the test device 100. The N OCC(s) is/are coupled to the N selective circuit(s) 122 in a predetermined manner (e.g., one-on-one manner), and include(s) the aforementioned $K^{th}$ OCC.

Figure 3:
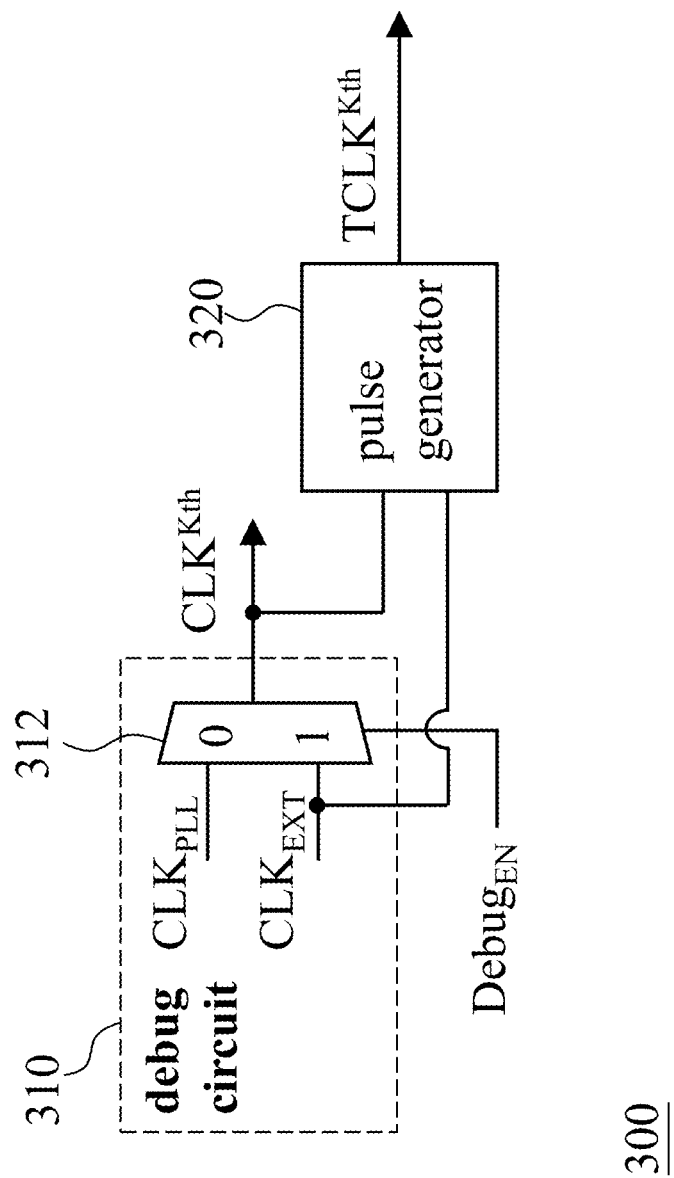
FIG. 3 shows an embodiment of a $K^{th}$ on-chip clocking circuit (OCC) to be tested by the test device of FIG. 1.

FIG. 3 shows an embodiment of the $K^{th}$ OCC. The $K^{th}$ OCC 300 of FIG. 3 includes a debug circuit 310 and a pulse generator 320. The debug circuit 310 includes a multiplexer 312. The multiplexer 312 is configured to output one of a phase-locked loop (PLL) clock $CLK_{PLL}$ (hereinafter referred to as "$CLK_{PLL}$") and a reliable clock $CLK_{EXT}$ (hereinafter referred to as "$CLK_{EXT}$") as the aforementioned $CLK^{Kth}$ according to a debug enable signal $Debug_{EN}$ (hereinafter referred to as "$Debug_{EN}$"). If the multiplexer 312 functions well: when $Debug_{EN}=0$, the multiplexer 312 outputs $CLK_{PLL}$; and when $Debug_{EN}=1$, the multiplexer 312 outputs $CLK_{EXT}$. The pulse generator 320 is configured to receive $CLK^{Kth}$ and $CLK_{EXT}$ and accordingly output a $K^{th}$ test clock $TCLK^{Kth}$ to a circuit under test (CUT) (not shown in the figures) to test the CUT. The detail of the pulse generator 320 is found in Applicant's US patent (U.S. Pat. No. 10,605,861 B2).

Figure 4:
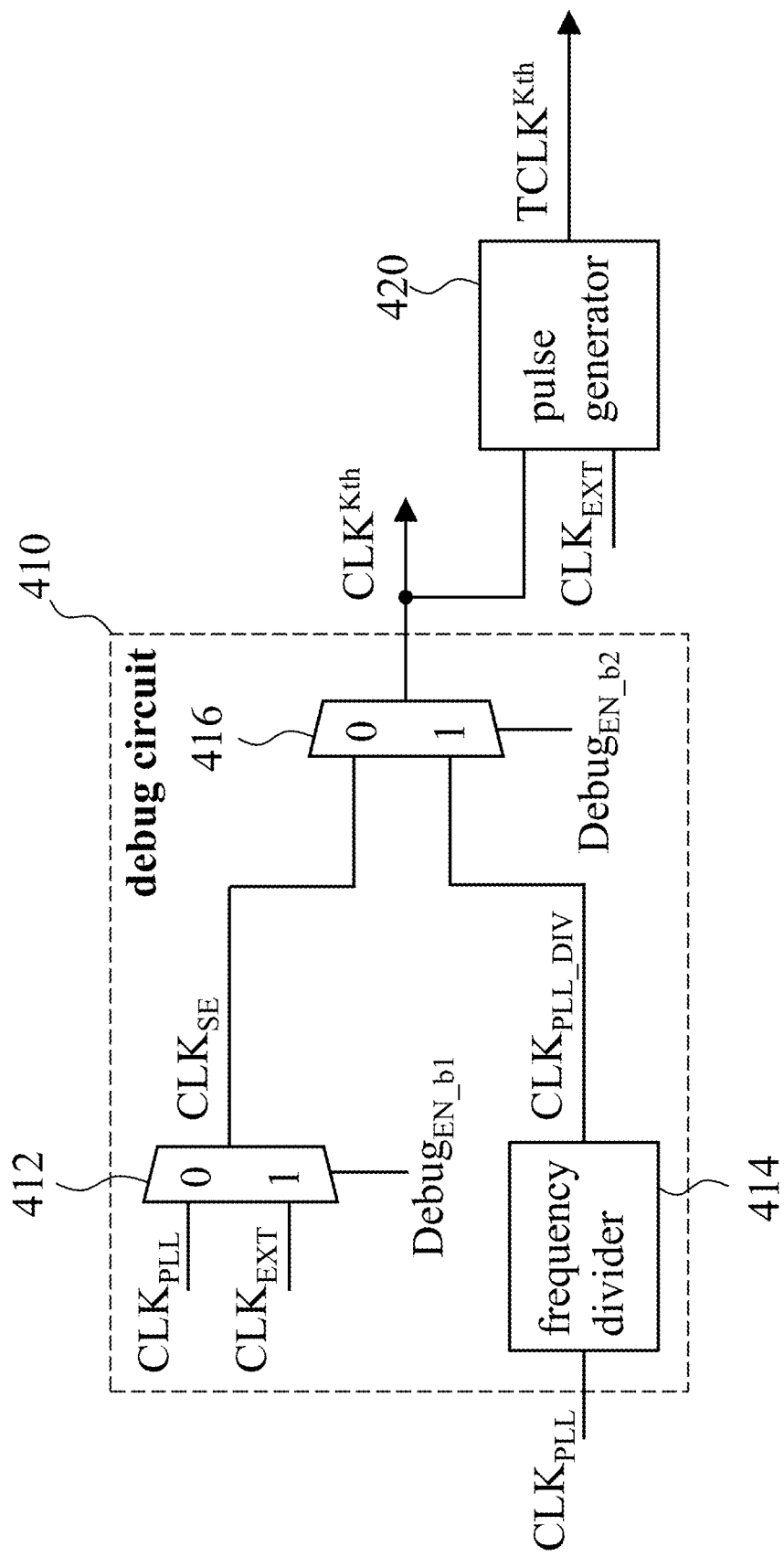
FIG. 4 shows another embodiment of a $K^{th}$ OCC to be tested by the test device of FIG. 1.

FIG. 4 shows another embodiment of the $K^{th}$ OCC. The $K^{th}$ OCC 400 of FIG. 4 includes a debug circuit 410 and a pulse generator 420, wherein the pulse generator 420 is the same as or similar to the pulse generator 320 of FIG. 3. The debug circuit 410 includes a first multiplexer 412, a frequency divider 414, and a second multiplexer 416. The first multiplexer 412 is configured to output one of $CLK_{PLL}$ and $CLK_{EXT}$ as a selection clock $CLK_{SE}$ (hereinafter referred to as "$CLK_{SE}$") according to a first bit of $Debug_{EN}$ (hereinafter referred to as "$Debug_{EN\_b1}$"). If the first multiplexer 412 functions well: when $Debug_{EN\_b1}=0$, the first multiplexer 412 outputs $CLK_{PLL}$; and when $Debug_{EN\_b1}=1$, the first multiplexer 412 outputs $CLK_{EXT}$. The frequency divider 414 is a known/self-developed frequency divider, and the frequency divider 414 is configured to generate M divisional clock(s) (not shown in the figures) according to $CLK_{PLL}$ and to output one divisional clock (hereinafter referred to as "$CLK_{PLL\_DIV}$") of the M divisional clock(s), wherein the M is a positive integer. When the M is greater than one, the frequency divider 414 includes a multiplexer (not shown in the figures) configured to select $CLK_{PLL\_DIV}$ from the M divisional clock(s) according to $Debug_{EN\_b1}$ and then output $CLK_{PLL\_DIV}$. The way to choose $CLK_{PLL\_DIV}$ can be determined according to the demand for implementation, and this falls beyond the scope of the present disclosure. The second multiplexer 416 is configured to output one of $CLK_{SE}$ and $CLK_{PLL\_DIV}$ as $CLK^{Kth}$ according to a second bit of $Debug_{EN}$ (hereinafter referred to as "$Debug_{EN\_b2}$"). If the second multiplexer 416 functions well: when $Debug_{EN\_b2}=0$, the second multiplexer 416 outputs $CLK_{SE}$ as $CLK^{Kth}$; and when $Debug_{EN\_b2}=1$, the second multiplexer 416 outputs $CLK_{PLL\_DIV}$ as $CLK^{Kth}$.

Figure 5A:
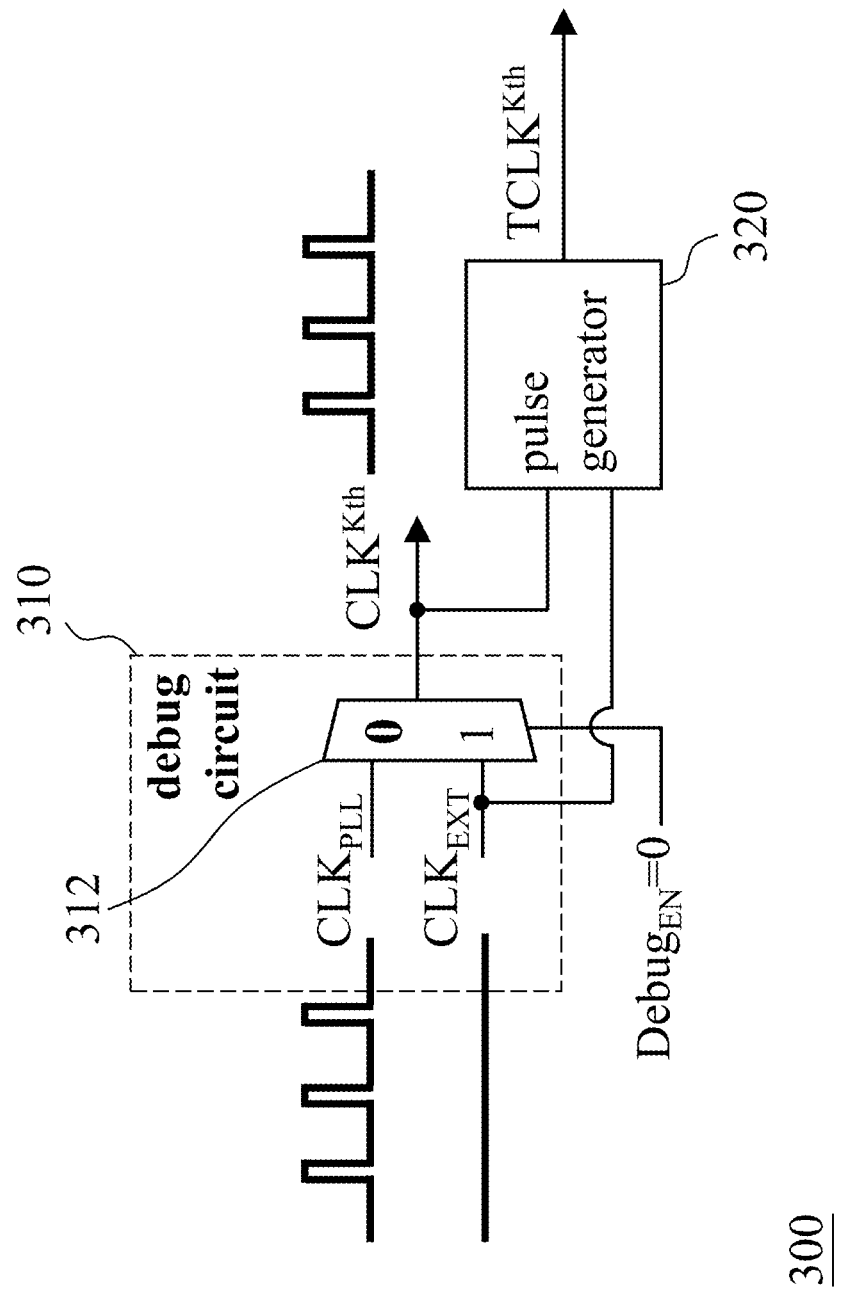
FIG. 5a shows a clock $CLK^{Kth}$ based on test setting when the multiplexer of the $K^{th}$ OCC of FIG. 3 functions normally.

Referring to FIGS. 1-3, in an exemplary implementation, the test device 100 of FIG. 1 is for testing the $K^{th}$ OCC 300 of FIG. 3 in the aforementioned debug circuit test mode. In this exemplary implementation, the aforementioned test setting includes: $Debug_{EN}=0$; $Obv_{DIS}=0$; $S_{IN}=0$; $D_{IN}=1$; $CLK_{PLL}$ is a free-running clock whose frequency $f_{CLK\_PLL}$ is greater than zero and is determined according to the demand for implementation; and the frequency of $CLK_{EXT}$ (hereinafter referred to as "$f_{CLK\_EXT}$") is zero. Based on the test setting:

(1) if the multiplexer 312 of the $K^{th}$ OCC 300 functions well, the multiplexer 312 outputs $CLK_{PLL}$ as $CLK^{Kth}$ as shown in FIG. 5a, wherein $CLK_{PLL}$ is represented with pulses.

Figure 6A:
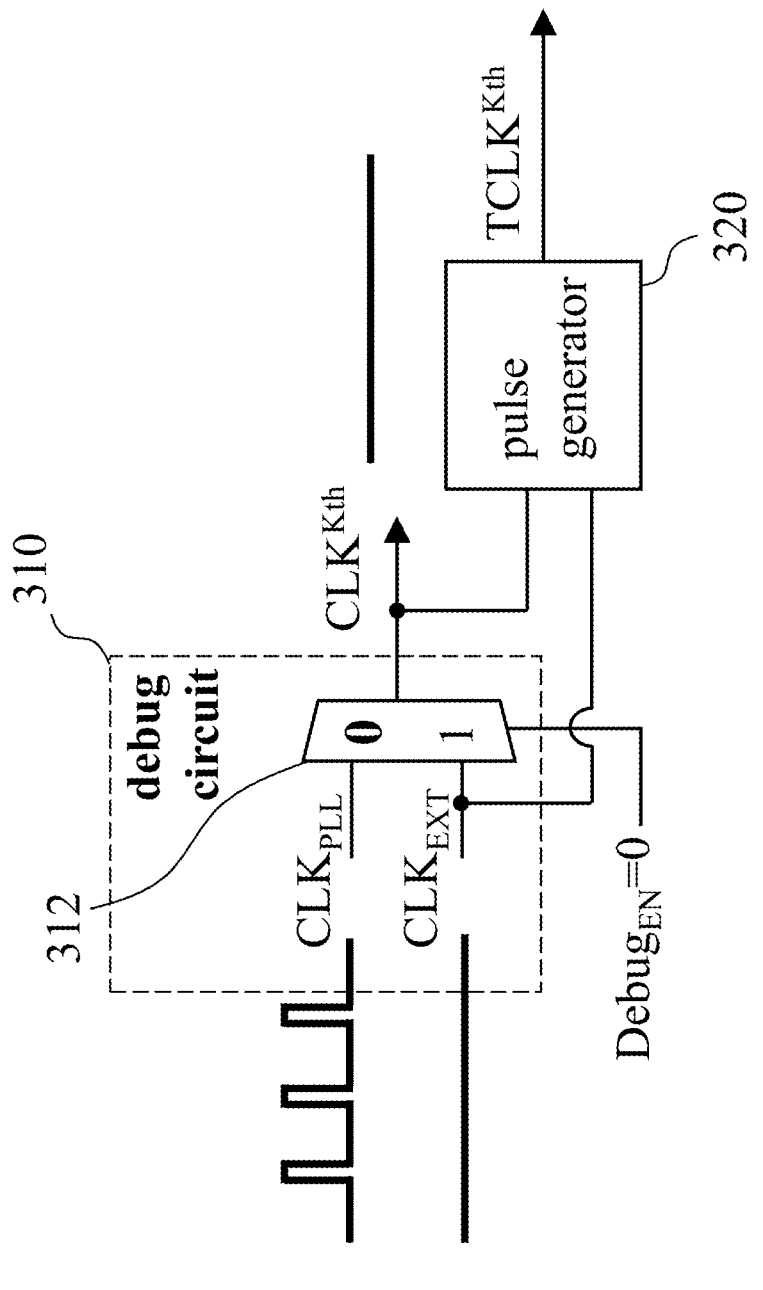
FIG. 6a shows $CLK^{Kth}$ based on test setting when the multiplexer of the $K^{th}$ OCC of FIG. 3 functions abnormally.

(2) if the multiplexer 312 of the $K^{th}$ OCC 300 functions problematically, the multiplexer 312 outputs $CLK_{EXT}$ as $CLK^{Kth}$ as shown in FIG. 6a, wherein $CLK_{EXT}$ is represented with a direct current (DC) level.

(3) since $Obv_{DIS}=0$, the output of the OR gate 140 (i.e., the selection signal SE) is equivalent to SEN.

(4) the aforementioned loading operation, the test operation, and the decision operation are performed in sequence (hereinafter referred to as "predetermined operation sequence"), and the SEN is set to 1 (during the loading operation), 0 (during the test operation), and 1 (during the decision operation) in turn.

(5) in accordance with the predetermined operation sequence, the $K^{th}$ input switch 210 is controlled by SEN to output $S_{IN}$, $D_{IN}$, and $S_{IN}$ in turn to the $K^{th}$ flip-flop 220.

(6) in accordance with the predetermined operation sequence, $CLK_{IND}$ is set to a free running clock ($f_{CLK\_IND}>0$), a zero-frequency clock ($f_{CLK\_IND}=0$), and a free running clock ($f_{CLK\_IND}>0$) in turn.

Figure 5B:
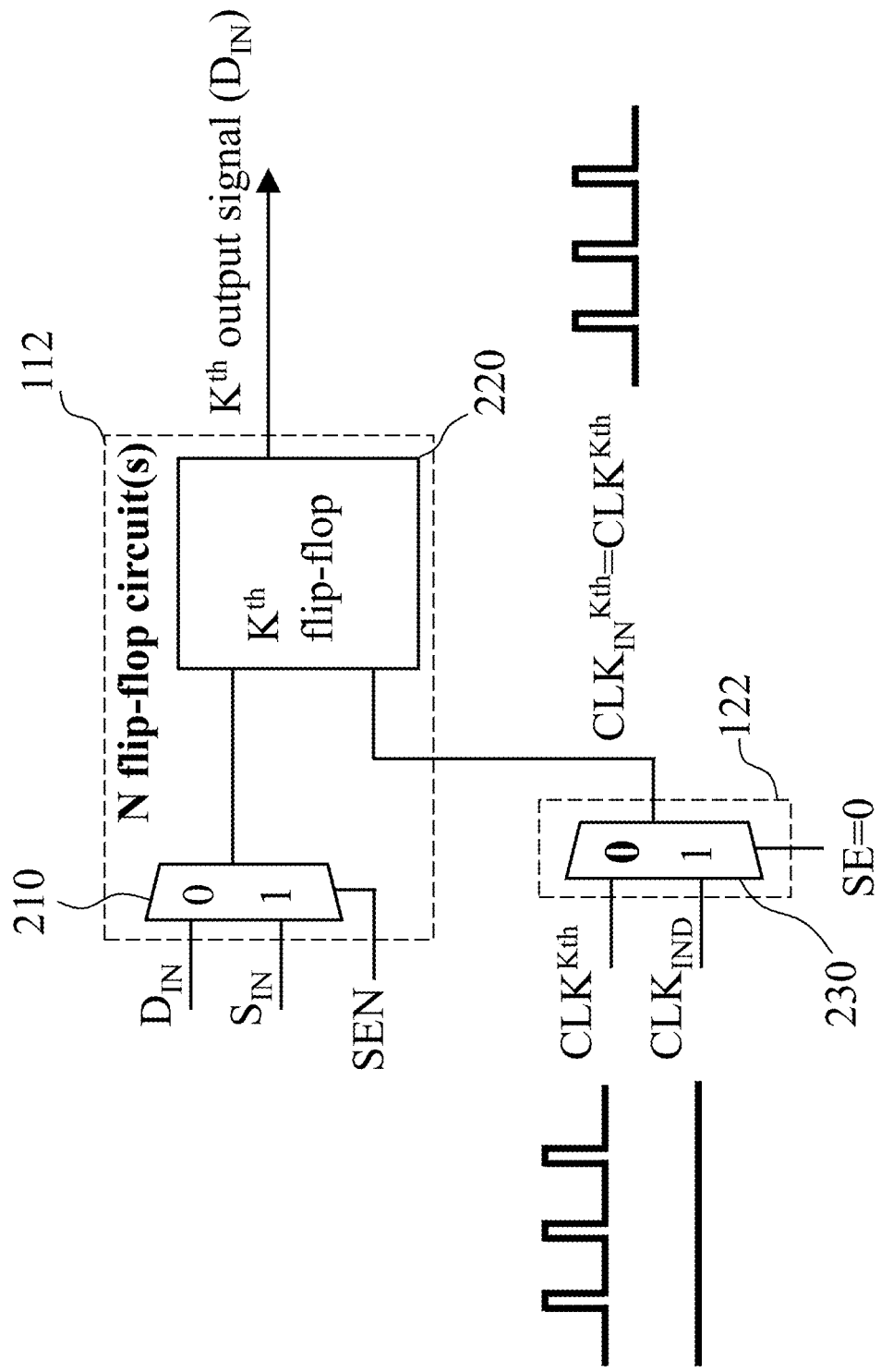
FIG. 5b shows the $K^{th}$ clock switch of FIG. 2 functions normally and thereby outputs $CLK^{Kth}$ of FIG. 5a as a $K^{th}$ input clock $CLK_{IN}^{Kth}$.
Figure 6B:
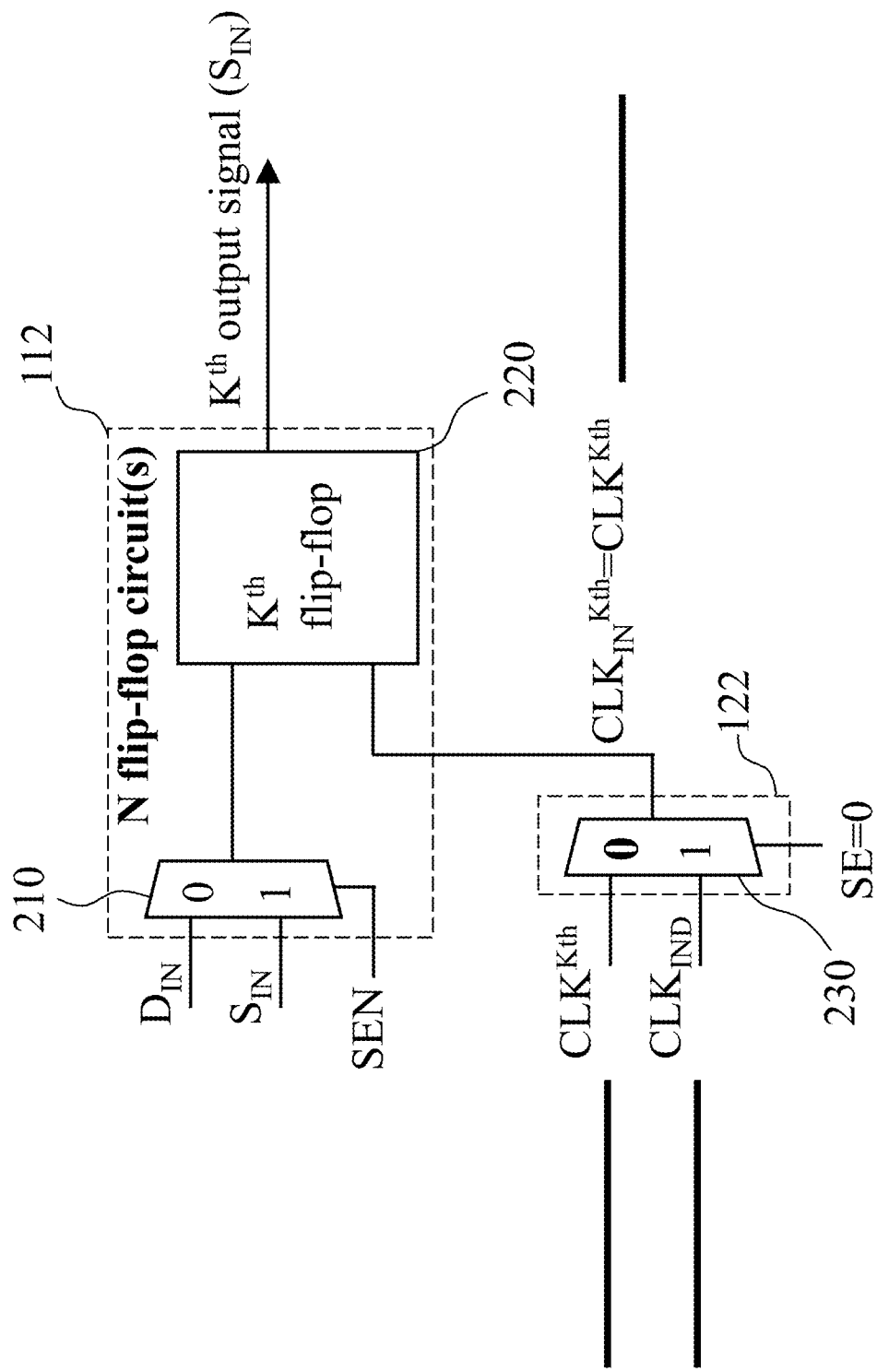
FIG. 6b shows the $K^{th}$ clock switch of FIG. 2 functions normally and thereby outputs $CLK^{Kth}$ of FIG. 5a as $CLK_{IN}^{Kth}$.

(7) if the $K^{th}$ clock switch 230 functions well, the $K^{th}$ clock switch 230 is controlled by the selection signal SE (SE=SEN due to $Obv_{DIS}=0$) to output $CLK_{IND}$, $CLK^{Kth}$, and $CLK_{IND}$ in turn as $CLK_{IN}^{Kth}$ so as to make the $K^{th}$ flip-flop 220 perform the following operations in order: storing $S_{IN}$ as the storage signal according to $CLK_{IN}^{Kth}$ (while SE=1, $CLK_{IN}^{Kth}$=$CLK_{IND}$, and $f_{CLK\_IND}$>0); replacing $S_{IN}$ with $D_{IN}$ as the storage signal according to $CLK_{IN}^{Kth}$ (while SE=0, the multiplexer 312 functioning well, $CLK_{IN}^{Kth}$=$CLK^{Kth}$=$CLK_{PLL}$, and $f_{CLK\_PLL}$>0) as shown in FIGS. 5a-5b, or keeping $S_{IN}$ as the storage signal according to $CLK_{IN}^{Kth}$ (while SE=0, the multiplexer 312 functioning problematically, $CLK_{IN}^{Kth}$=$CLK^{Kth}$=$CLK_{EXT}$, and $f_{CLK\_EXT}$=0) as shown in FIGS. 6a-6b; and outputting the storage signal as the $K^{th}$ output signal according to $CLK_{IN}^{Kth}$ (while SE=1, $CLK_{IN}^{Kth}$=$CLK_{IND}$, and $f_{CLK\_IND}$>0).

Figure 6C:
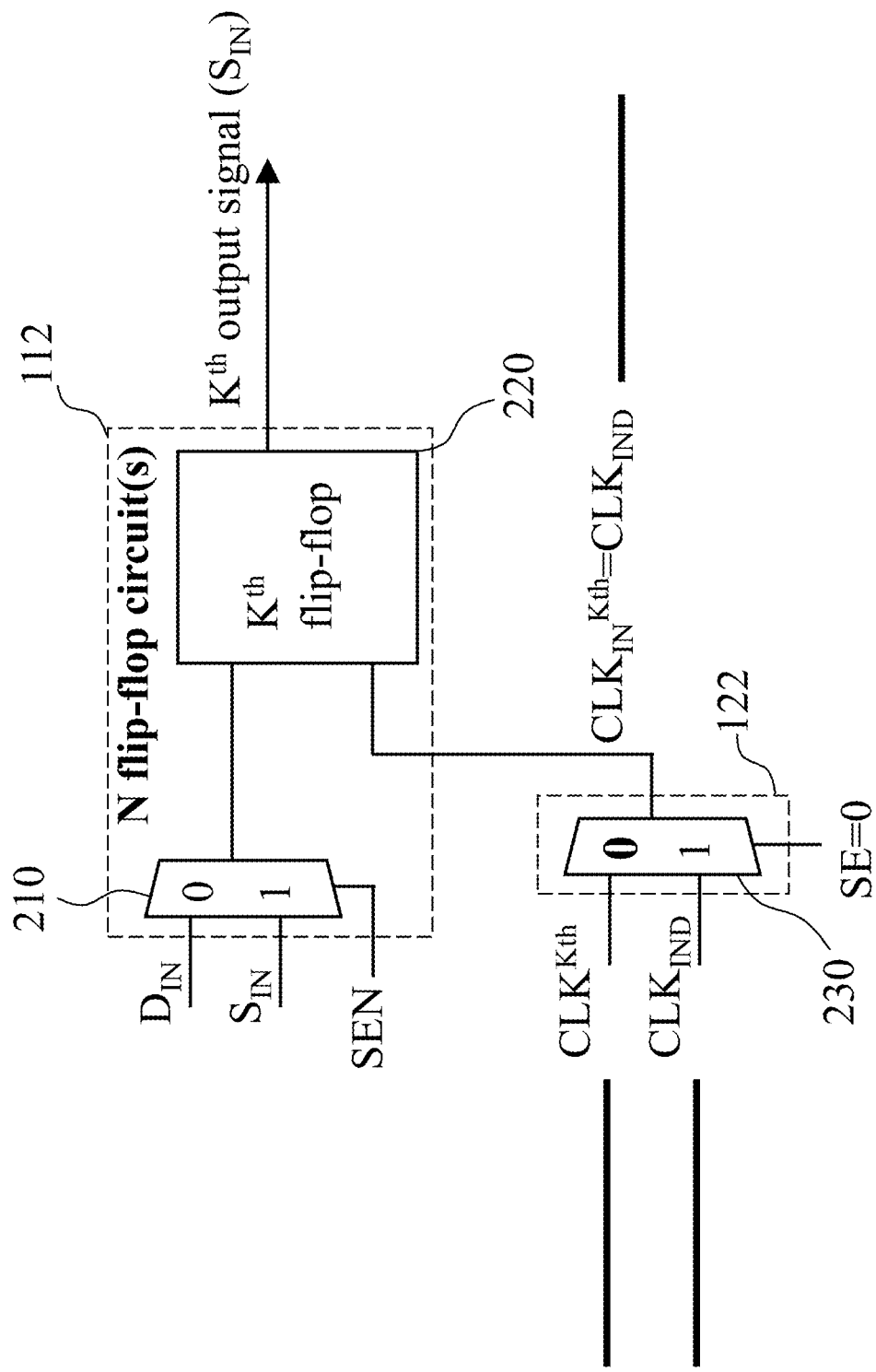
FIG. 6c shows the $K^{th}$ clock switch of FIG. 2 functions abnormally and thereby outputs an independent clock $CLK_{IND}$ as $CLK_{IN}^{Kth}$.

(8) if the $K^{th}$ clock switch 230 functions abnormally and is restricted to outputting $CLK_{IND}$ as $CLK_{IN}^{Kth}$, the $K^{th}$ flip-flop 220 performs the following operations in the predetermined operation sequence: storing $S_{IN}$ as the storage signal according to $CLK_{IN}^{Kth}$ (while SE=1, $CLK_{IN}^{Kth}$=$CLK_{IND}$, and $f_{CLK\_IND}$>0); keeping $S_{IN}$ as the storage signal according to $CLK_{IN}^{Kth}$ (while SE=0, $CLK_{IN}^{Kth}$=$CLK_{IND}$, and $f_{CLK\_IND}$=0) as shown in FIG. 6c; and outputting the storage signal as the $K^{th}$ output signal according to $CLK_{IN}^{Kth}$ (while SE=1, $CLK_{IN}^{Kth}$=$CLK^{IND}$, and $f_{CLK\_IND}$>0).

In light of the above, when both the multiplexer 312 and the $K^{th}$ clock switch 230 function normally, the $K^{th}$ output signal is $D_{IN}$; and when any of the multiplexer 312 and the $K^{th}$ clock switch 230 functions abnormally, the $K^{th}$ output signal is $S_{IN}$. It is noted that the content of the test setting and/or the frequency setting of any of the clocks mentioned above can be adjusted or can have allowed errors provided the whole debug circuit test can proceed well.

Figure 7:
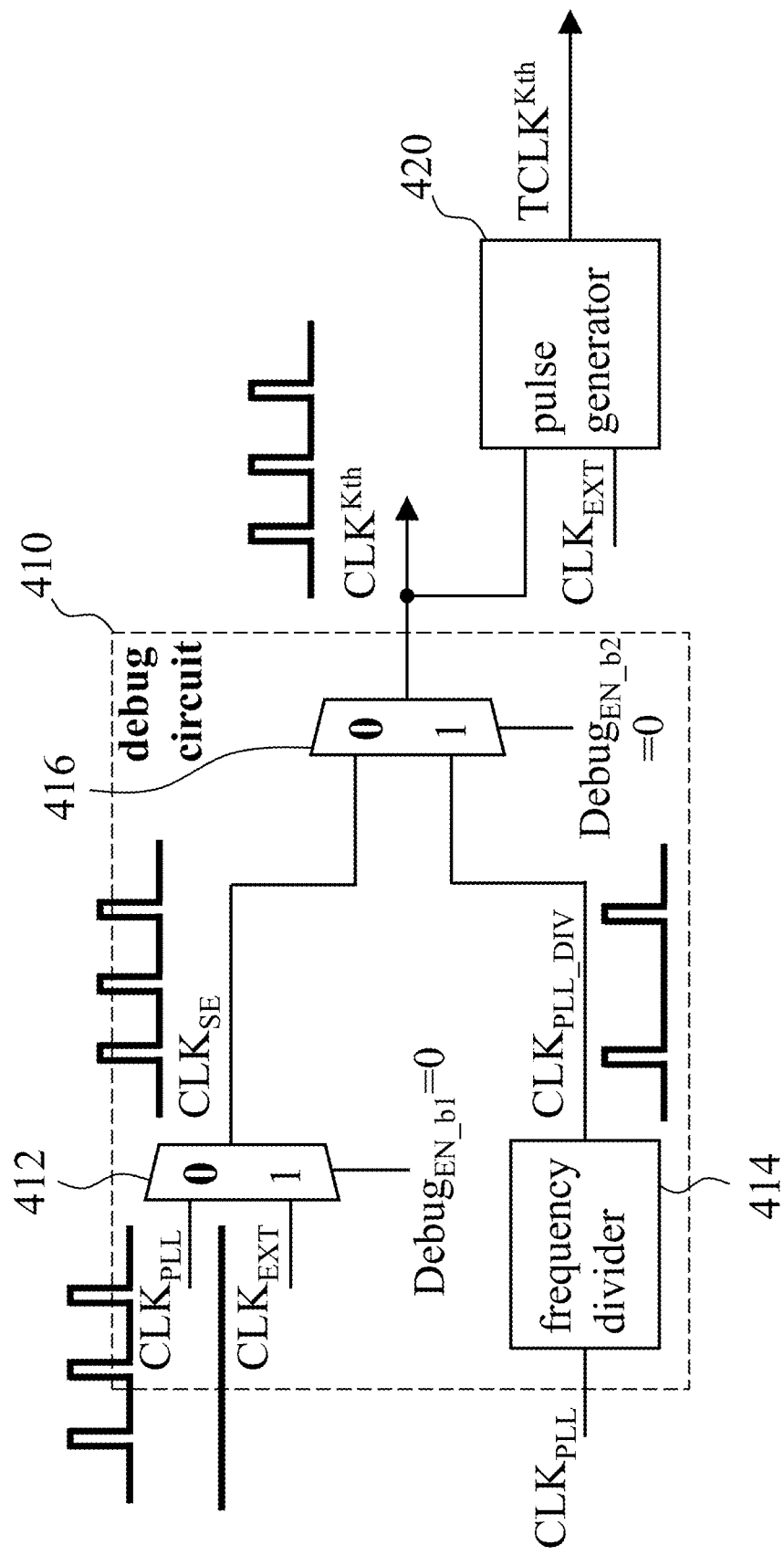
FIG. 7 shows $CLK^{Kth}$ based on test setting when the first multiplexer of the $K^{th}$ OCC of FIG. 4 functions normally provided the second multiplexer of the $K^{th}$ OCC of FIG. 4 functions normally.

Referring to FIGS. 1-2 and 4, in an exemplary implementation, the test device 100 of FIG. 1 is for testing the $K^{th}$ OCC 400 of FIG. 4 in a first test procedure under the aforementioned debug circuit test mode. In this exemplary implementation, the aforementioned test setting includes: both the first bit ($Debug_{EN\_b1}$) and the second bit ($Debug_{EN\_b2}$) of $Debug_{EN}$ are 0; $Obv_{DIS}$=0; $S_{IN}$=0; $D_{IN}$=1; $CLK_{PLL}$ is a free-running clock; and the frequency of $CLK_{EXT}$ (hereinafter referred to as "$f_{CLK\_EXT}$") is zero. Based on the test setting:

(1) assuming that the second multiplexer 416 of the $K^{th}$ OCC 400 functions well, if the first multiplexer 412 of the $K^{th}$ OCC 400 functions well, the second multiplexer 416 outputs $CLK_{PLL}$ as $CLK^{Kth}$ as shown in FIG. 7.

Figure 8:
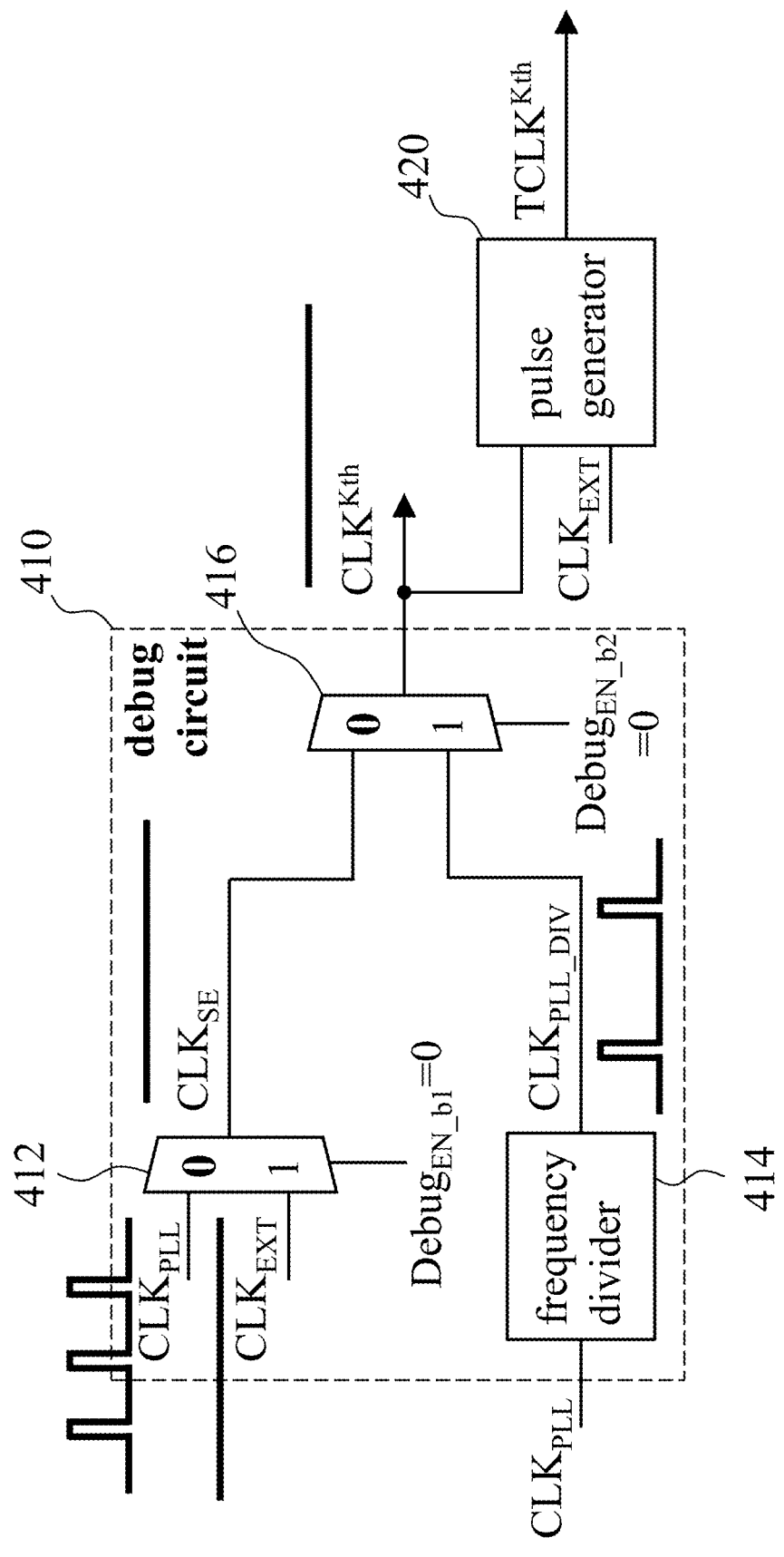
FIG. 8 shows $CLK^{Kth}$ based on test setting when the first multiplexer of the $K^{th}$ OCC of FIG. 4 functions abnormally provided the second multiplexer of the $K^{th}$ OCC of FIG. 4 functions normally.

(2) assuming that the second multiplexer 416 functions well, if the first multiplexer 412 of the $K^{th}$ OCC 400 functions problematically, the second multiplexer 416 outputs $CLK_{EXT}$ as $CLK^{Kth}$ as shown in FIG. 8.

(3) since $Obv_{DIS}$=0, the output of the OR gate 140 (i.e., the selection signal SE) is equivalent to SEN.

(4) in accordance with the predetermined operation sequence, the SEN is set to 1, 0, and 1 in turn.

(5) in accordance with the predetermined operation sequence, the $K^{th}$ input switch 210 is controlled by SEN to output $S_{IN}$, $D_{IN}$, and $S_{IN}$ in turn to the $K^{th}$ flip-flop 220.

(6) in accordance with the predetermined operation sequence, $CLK_{IND}$ is set to a free running clock ($f_{CLK\_IND}$>0), a zero-frequency clock ($f_{CLK\_IND}$=0), and a free running clock ($f_{CLK\_IND}$>0) in turn.

(7) if the $K^{th}$ clock switch 230 functions well, the $K^{th}$ clock switch 230 is controlled by the selection signal SE (SE=SEN due to $Obv_{DIS}$=0) to output $CLK_{IND}$, $CLK^{Kth}$, and $CLK_{IND}$ in turn as $CLK_{IN}^{Kth}$ so as to make the $K^{th}$ flip-flop 220 perform the following operations in the predetermined operation sequence: storing $S_{IN}$ as the storage signal according to $CLK_{IN}^{Kth}$ (while SE=1, $CLK_{IN}^{Kth}$=$CLK_{IND}$, and $f_{CLK\_IND}$>0); replacing $S_{IN}$ with $D_{IN}$ as the storage signal according to $CLK_{IN}^{Kth}$ (while SE=0, the first multiplexer 412 functioning well, $CLK_{IN}^{Kth}$=$CLK^{Kth}$=$CLK_{PLL}$, and $f_{CLK\_PLL}$>0) as shown in FIGS. 7 and 5b, or keeping $S_{IN}$ as the storage signal according to $CLK_{IN}^{Kth}$ (while SE=0, the first multiplexer 412 functioning problematically, $CLK_{IN}^{Kth}$=$CLK^{Kth}$=$CLK_{EXT}$, and $f_{CLK\_EXT}$=0) as shown in FIGS. 8 and 6b; and outputting the storage signal as the $K^{th}$ output signal according to $CLK_{IN}^{Kth}$ (while SE=1, $CLK_{IN}^{Kth}$=$CLK_{IND}$, and $f_{CLK\_IND}$>0).

(8) if the $K^{th}$ clock switch 230 functions abnormally and is restricted to outputting $CLK_{IND}$ as $CLK_{IN}^{Kth}$, the $K^{th}$ flip-flop 220 performs the following operations in sequence: storing $S_{IN}$ as the storage signal according to $CLK_{IN}^{Kth}$ (while SE=1, $CLK_{IN}^{Kth}$=$CLK_{IND}$, and $f_{CLK\_IND}$>0); keeping $S_{IN}$ as the storage signal according to $CLK_{IN}^{Kth}$ (while SE=0, $CLK_{IN}^{Kth}$=$CLK_{IND}$, and $f_{CLK\_IND}$=0) as shown in FIG. 6c; and outputting the storage signal as the $K^{th}$ output signal according to $CLK_{IN}^{Kth}$ (while SE=1, $CLK_{IN}^{Kth}$=$CLK_{IND}$, and $f_{CLK\_IND}$>0).

In light of the above, when both the first multiplexer 412 and the $K^{th}$ clock switch 230 function normally, the $K^{th}$ output signal is $D_{IN}$; and when any of the first multiplexer 412 and the $K^{th}$ clock switch 230 functions abnormally, the $K^{th}$ output signal is $S_{IN}$.

Figure 9A:
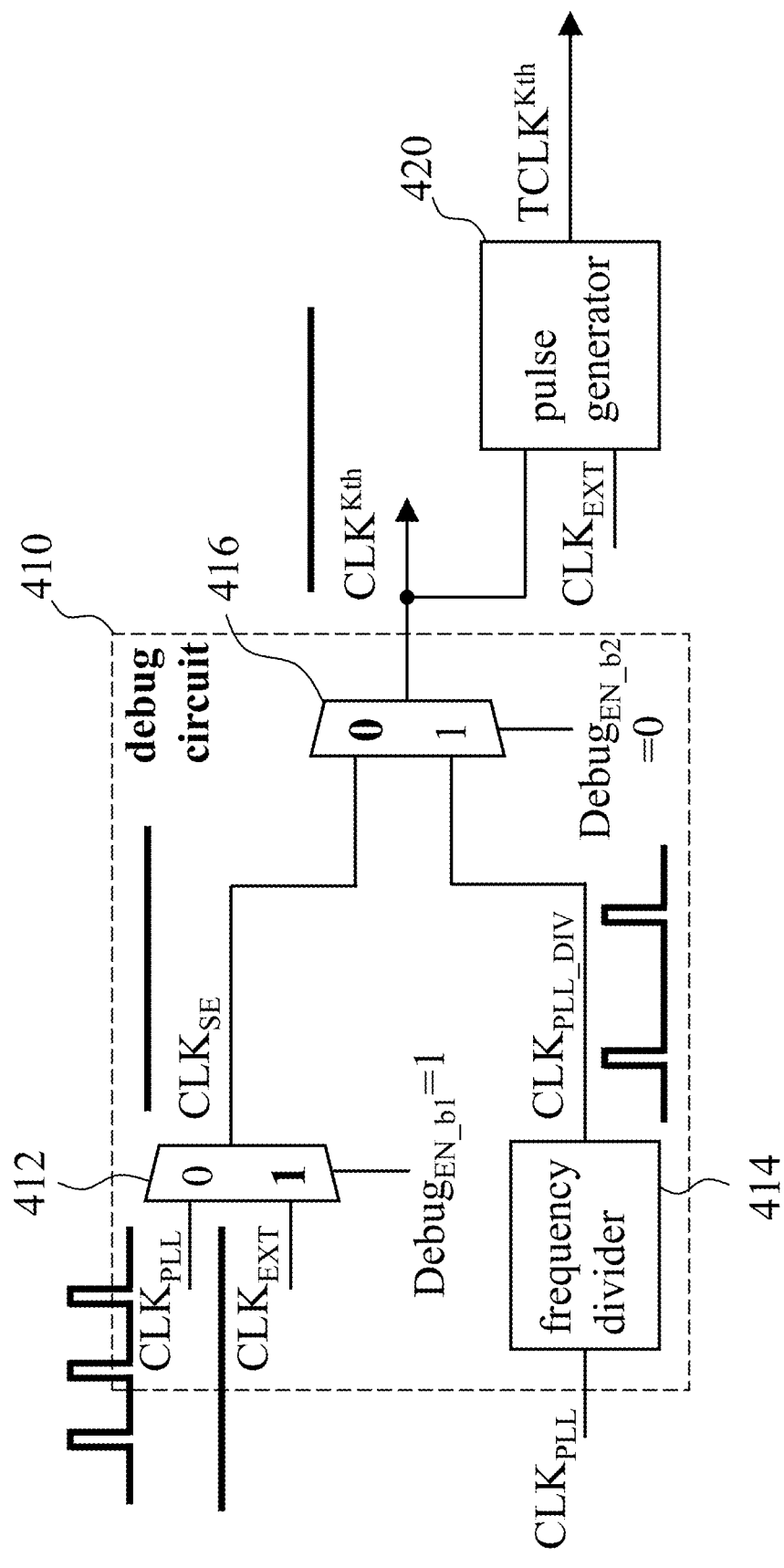
FIG. 9a shows $CLK^{Kth}$ based on test setting when the second multiplexer of the $K^{th}$ OCC of FIG. 4 functions normally provided the first multiplexer of the $K^{th}$ OCC of FIG. 4 functions normally.

Referring to FIGS. 1-2 and 4, in an exemplary implementation, the test device 100 of FIG. 1 is for testing the $K^{th}$ OCC 400 of FIG. 4 in a second test procedure under the aforementioned debug circuit test mode. Since the first multiplexer 412 and the $K^{th}$ clock switch 230 have been tested in the aforementioned first test procedure, in the second test procedure the second multiplexer 416 of the $K^{th}$ OCC 400 is the circuit under test. In this exemplary implementation, the aforementioned test setting includes: $Debug_{EN\_b1}$ and $Debug_{EN\_b2}$ are 1 and 0 respectively; $Obv_{DIS}$=0; $S_{IN}$=0; $D_{IN}$=1; $CLK_{PLL}$ is a free-running clock; and the frequency of $CLK_{EXT}$ (hereinafter referred to as "$f_{CLK\_EXT}$") is zero. Based on the test setting:

(1) assuming that the first multiplexer 412 functions well, if the second multiplexer 416 functions well, the second multiplexer 416 outputs $CLK_{EXT}$ as $CLK^{Kth}$ as shown in FIG. 9a.

Figure 10A:
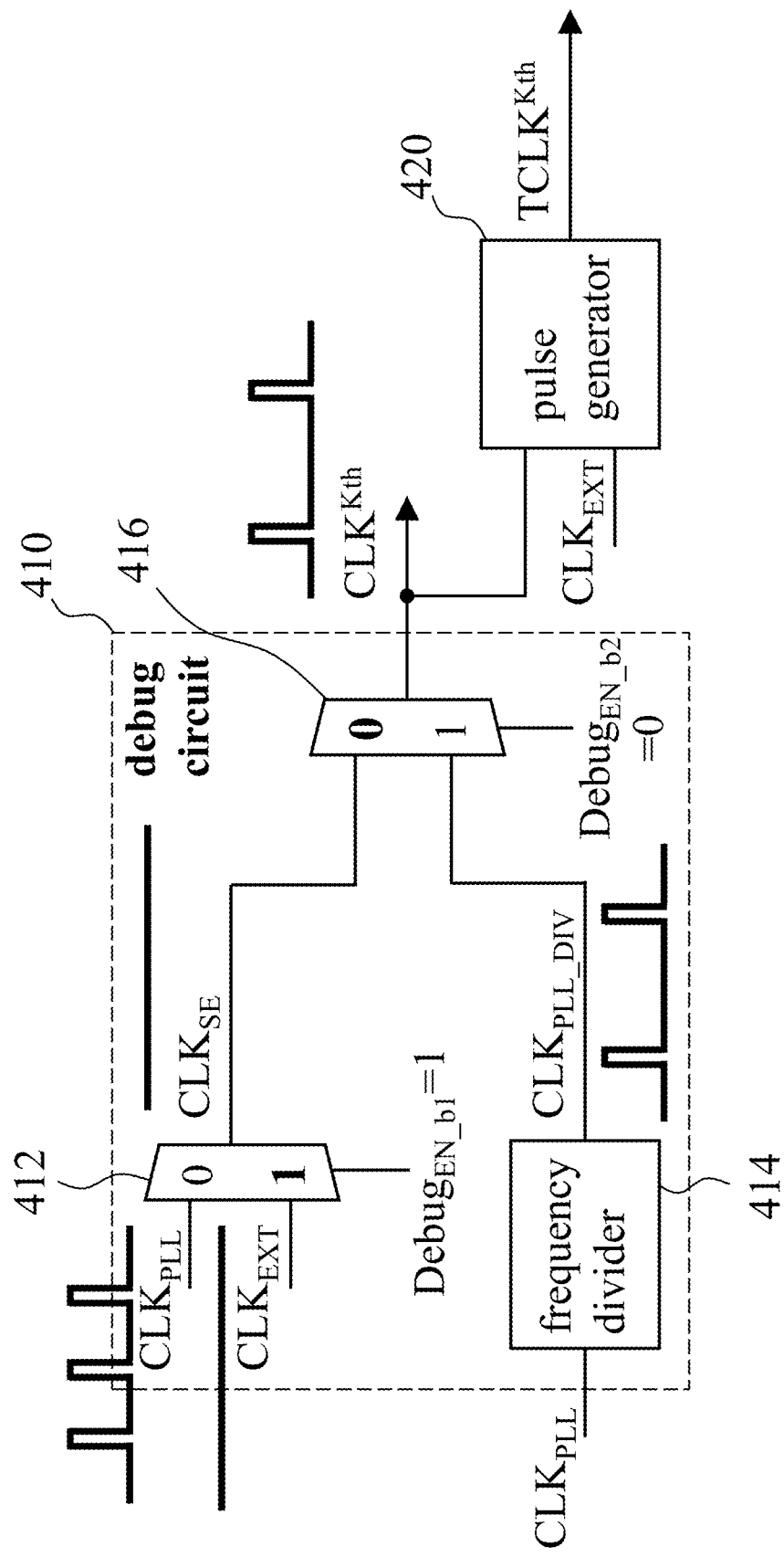
FIG. 10a shows $CLK^{Kth}$ based on test setting when the second multiplexer of the $K^{th}$ OCC of FIG. 4 functions abnormally provided the first multiplexer of the $K^{th}$ OCC of FIG. 4 functions normally.

(2) assuming that the first multiplexer 412 functions well, if the second multiplexer 416 functions problematically, the second multiplexer 416 outputs a divisional clock $CLK_{PLL\_DIV}$ of $CLK_{PLL}$ as $CLK^{Kth}$ as shown in FIG. 10a.

(3) since $Obv_{DIS}$=0, the output of the OR gate 140 (i.e., the selection signal SE) is equivalent to SEN.

(4) in accordance with the predetermined operation sequence, the SEN is set to 1, 0, and 1 in turn.

(5) in accordance with the predetermined operation sequence, the $K^{th}$ input switch 210 is controlled by SEN to output $S_{IN}$, $D_{IN}$, and $S_{IN}$ in turn to the $K^{th}$ flip-flop 220.

(6) in accordance with the predetermined operation sequence, $CLK_{IND}$ is set to a free running clock ($f_{CLK\_IND}$>0), a zero-frequency clock ($f_{CLK\_IND}$=0), and a free running clock ($f_{CLK\_IND}$>0) in turn.

Figure 9B:
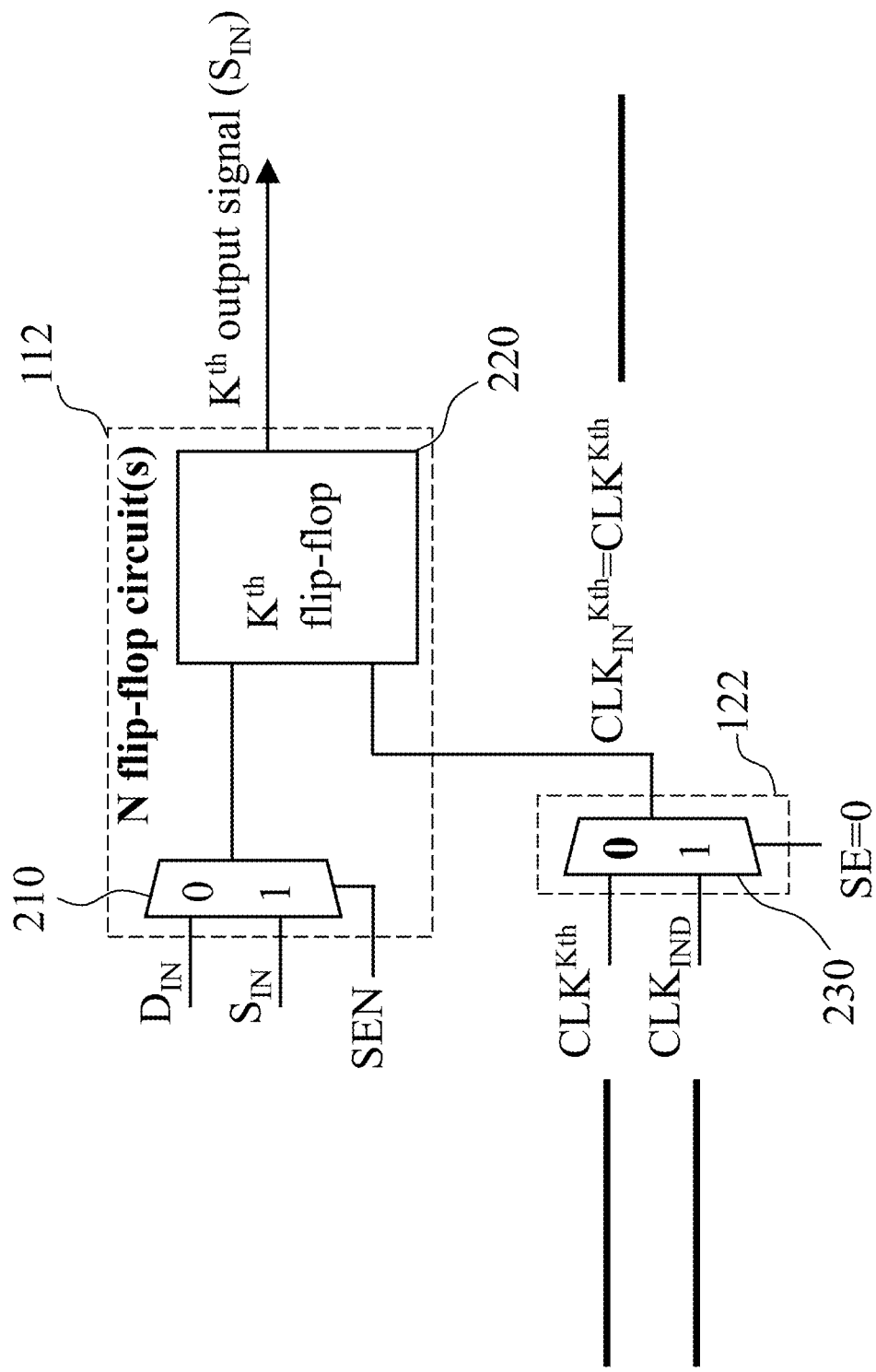
FIG. 9b shows the $K^{th}$ clock switch of FIG. 2 functions normally and thereby outputs $CLK^{Kth}$ of FIG. 9a as $CLK_{IN}^{Kth}$.
Figure 10B:
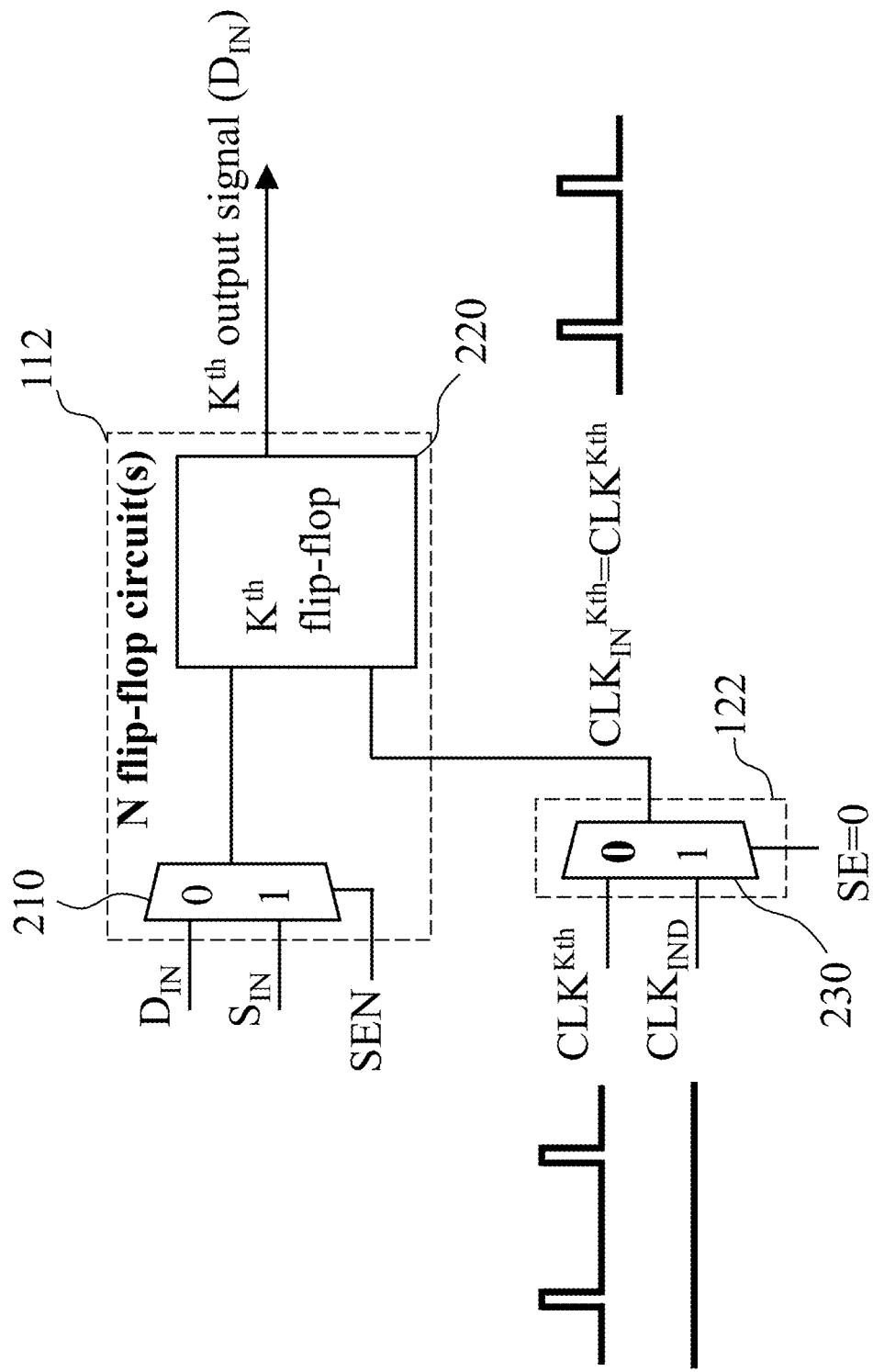
FIG. 10b shows the $K^{th}$ clock switch of FIG. 2 functions normally and thereby outputs $CLK^{Kth}$ of FIG. 10a as $CLK_{IN}^{Kth}$.

(7) assuming that the $K^{th}$ clock switch 230 functions well, the $K^{th}$ clock switch 230 is controlled by the selection signal SE (SE=SEN due to $Obv_{DIS}$=0) to output $CLK_{IND}$, $CLK^{Kth}$, and $CLK_{IND}$ in turn as $CLK_{IN}$ so as to make the $K^{th}$ flip-flop 220 perform the following operations in the predetermined operation sequence: storing $S_{IN}$ as the storage signal according to $CLK_{IN}^{Kth}$ (while SE=1, $CLK_{IN}^{Kth}$=$CLK_{IND}$, and $f_{CLK\_IND}$>0); keeping $S_{IN}$ as the storage signal according to $CLK_{IN}^{Kth}$ (while SE=0, the second multiplexer 416 functioning well, $CLK_{IN}^{Kth}$=$CLK^{Kth}$=$CLK_{EXT}$, and $f_{CLK\_EXT}$=0) as shown in FIGS. 9a-9b, or replacing $S_{IN}$ with $D_{IN}$ as the storage signal according to $CLK_{IN}^{Kth}$ (while SE=0, the second multiplexer 416 functioning abnormally, $CLK_{IN}^{Kth}$=$CLK^{Kth}$=$CLK_{PLL\_DIV}$, and $f_{CLK\_PLL}$>0) as shown in FIGS. 10a-10b; and outputting the storage signal as the $K^{th}$ output signal according to $CLK_{IN}^{Kth}$ (while SE=1, $CLK_{IN}^{Kth}$=$CLK_{IND}$, and $f_{CLK\_IND}$>0).

In light of the above, when the second multiplexer 416 functions normally, the $K^{th}$ output signal is $S_{IN}$; and when the second multiplexer 416 functions abnormally, the $K^{th}$ output signal is $D_{IN}$.

Referring to FIGS. 1-4, in an exemplary implementation, the test device 100 of FIG. 1 is for testing its own OR gate 140 and testing circuit 120 in the aforementioned normal test mode. In this exemplary implementation, the aforementioned test setting includes: $Debug_{EN}$ of FIG. 3 is 0 (or both the first bit ($Debug_{EN\_b1}$) and the second bit ($Debug_{EN\_b2}$) of $Debug_{EN}$ of FIG. 4 are 0); $Obv_{DIS}$=1; $S_{IN}$=0; $D_{IN}$=1; $CLK_{PLL}$ is a free-running clock; and the frequency of $CLK_{EXT}$ (hereinafter referred to as "$f_{CLK\_EXT}$") is zero. Based on the test setting:

(1) the $K^{th}$ OCC 300 (or the $K^{th}$ OCC 400) functions well and thereby outputs $CLK_{PLL}$ as $CLK^{Kth}$ as shown in FIG. 5a (or FIG. 7).

(2) since $Obv_{DIS}$=1: if the OR gate 140 functions well, the output of the OR gate 140 (i.e., the selection signal SE) is equivalent to $Obv_{DIS}$ (i.e., 1); and if the OR gate 140 functions problematically, the output of the OR gate (i.e., the selection signal SE) is 0.

(3) in accordance with the predetermined operation sequence (i.e., the sequence of the loading operation, the test operation, and the decision operation), the SEN is set to 1, 0, and 1 in turn.

(4) in accordance with the predetermined operation sequence, the $K^{th}$ input switch 210 is controlled by SEN to output $S_{IN}$, $D_{IN}$, and $S_{IN}$ in turn to the $K^{th}$ flip-flop 220.

(5) in accordance with the predetermined operation sequence, $CLK_{IND}$ is set to a free running clock ($f_{CLK\_IND}$>0), a zero-frequency clock ($f_{CLK\_IND}$=0), and a free running clock ($f_{CLK\_IND}$>0) in turn.

(6) if both the $K^{th}$ clock switch 230 and the OR gate 140 function well, the $K^{th}$ clock switch 230 is controlled by SE (SE=$Obv_{DIS}$=1) to output $CLK_{IND}$ as $CLK_{IN\_Kth}$ so as to make the $K^{th}$ flip-flop 220 perform the following operations in sequence: storing $S_{IN}$ as the storage signal according to $CLK_{IN}^{Kth}$ (while SE=1, $CLK_{IN}^{Kth}$=$CLK_{IND}$, and $f_{CLK\_IND}$>0); keeping $S_{IN}$ as the storage signal according to $CLK_{IN}^{Kth}$ (while SE=1, $CLK_{IN}^{Kth}$=$CLK_{IND}$, and $f_{CLK\_IND}$=0); and outputting the storage signal as the $K^{th}$ output signal according to $CLK_{IN}^{Kth}$ (while SE=1, $CLK_{IN}^{Kth}$=$CLK_{IND}$, and $f_{CLK\_IND}$>0).

(7) if the $K^{th}$ clock switch 230 functions problematically (i.e., the $K^{th}$ clock switch 230 does not output $CLK_{IND}$ according to $Obv_{DIS}$ but outputs $CLK^{Kth}$ (i.e., $CLK_{PLL}$) as $CLK_{IN}^{Kth}$) or the OR gate 140 functions problematically (i.e., the OR gate 140 outputs 0 as the selection signal SE and thereby makes the $K^{th}$ clock switch 230 output $CLK^{Kth}$ as $CLK_{IN}^{Kth}$), the $K^{th}$ flip-flop 220 performs the following operations in sequence: storing $S_{IN}$ as the storage signal according to $CLK_{IN}^{Kth}$ (while SE=I/O, $CLK_{IN}^{Kth}$=$CLK^{Kth}$=$CLK_{PLL}$, and $f_{CLK\_PLL}$>0); replacing $S_{IN}$ with $D_{IN}$ as the storage signal according to $CLK_{IN}^{Kth}$ (while SE=I/O, $CLK_{IN}^{Kth}$=$CLK^{Kth}$=$CLK_{PLL}$); and outputting the storage signal as the $K^{th}$ output signal according to $CLK_{IN}^{Kth}$ (while SE=I/O, $CLK_{IN}^{Kth}$=$CLK^{Kth}$=$CLK_{PLL}$).

In light of the above, when both the OR gate 140 and the $K^{th}$ clock switch 230 function normally, the $K^{th}$ output signal is $S_{IN}$; and when any of the OR gate 140 and the $K^{th}$ clock switch 230 functions abnormally, the $K^{th}$ output signal is $D_{IN}$.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention is flexible based on the present disclosure.

To sum up, the test device of the present disclosure can test an on-chip clock controller having a debug function (e.g., an on-chip clock controller having one or more OCC(s) for realizing the debug function) to find out whether the debug function is problematic. In addition, the test device of the present disclosure can perform a self-test.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A test device for testing an on-chip clock controller, the test device comprising:
   a scan chain including N flip-flop circuit(s) from a first flip-flop circuit to an $N^{th}$ flip-flop circuit in sequence, wherein the N is a positive integer, a $K^{th}$ flip-flop circuit is one of the N flip-flop circuit(s), K is a positive integer less than or equal to the N, and the $K^{th}$ flip-flop circuit of the N flip-flop circuit(s) includes:
      a kth input switch configured to output one of a first input signal and a second input signal as an input signal according to a scan enable (SEN) signal; and
      a $K^{th}$ flip-flop configured to store the input signal and output a stored signal as a $K^{th}$ output signal according to an input clock, wherein the stored signal is one of the first input signal and the second input signal; and
   a test circuit including:
      N selective circuit(s) coupled with the N flip-flop circuit(s) respectively, wherein the N selective circuit(s) include a first selective circuit to an $N^{th}$ selective circuit in sequence and corresponding to the N flip-flop circuit(s) respectively, so that a $K^{th}$ selective circuit of the N selective circuit(s) corresponds to the $K^{th}$ flip-flop circuit and the $K^{th}$ selective circuit includes:
         a $K^{th}$ clock switch configured to output one of a $K^{th}$ observation clock and an independent clock as the input clock for the $K^{th}$ flip-flop according to a selection signal, wherein in a debug circuit test mode, the selection signal is determined according to the SEN signal and the $K^{th}$ observation clock is from a $K^{th}$ on-chip clocking circuit (OCC) of the on-chip clock controller, wherein the $K^{th}$ input switch outputs the first input signal according to a first signal value of the SEN signal first to let the $K^{th}$ flip-flop store the first input signal according to the input clock while a value of the first input signal is a first input value; then the $K^{th}$ input switch outputs the second input signal according to a second signal value of the SEN signal, and the $K^{th}$ flip-flop replaces the first input signal with the second input signal or keeps the first input signal according to the input clock while a value of the second input signal is a second input value that is different from the first input value; and then the $K^{th}$ output signal of the $K^{th}$ flip-flop indicates whether the input clock triggers the $K^{th}$ flip-flop under test setting and thereby shows whether circuit(s) under test (CUT(s)) for transmission of the input clock function(s) normally.

2. The test device of claim 1, wherein the $K^{th}$ observation clock is one of a phase-locked loop (PLL) clock and a reference clock; and in the debug circuit test mode, the CUT(s) include(s) the $K^{th}$ clock switch and a multiplexer of the $K^{th}$ OCC, and when a value of the $K^{th}$ output signal is the first input value, the $K^{th}$ output signal of the $K^{th}$ flip-flop indicates the $K^{th}$ flip-flop is not triggered to store the second input signal and thereby shows at least one of the CUT(s) function(s) abnormally.

3. The test device of claim 1, wherein the $K^{th}$ observation clock is one of a phase-locked loop (PLL) clock, a reference clock, and a divisional clock of the PLL clock; and in a first test procedure under the debug circuit test mode, the CUT(s) include(s) the $K^{th}$ clock switch and a first multiplexer of the $K^{th}$ OCC that is configured to output one of the PLL clock and the reference clock, and when a value of the $K^{th}$ output signal is the first input value, the $K^{th}$ output signal of the $K^{th}$ flip-flop indicates the $K^{th}$ flip-flop is not triggered to store the second input signal and thereby shows at least one of the CUT(s) function(s) abnormally.

4. The test device of claim 1, wherein the $K^{th}$ observation clock is one of a phase-locked loop (PLL) clock, a reference clock, and a divisional clock of the PLL clock; and in a second test procedure under the debug circuit test mode, the CUT(s) include(s) a second multiplexer of the $K^{th}$ OCC that is configured to output the divisional clock or one of the PLL clock and the reference clock, and when a value of the $K^{th}$ output signal is the second input value, the $K^{th}$ output signal of the $K^{th}$ flip-flop indicates the $K^{th}$ flip-flop is triggered to store the second input signal and thereby shows at least one of the CUT(s) function(s) abnormally.

5. The test device of claim 1, wherein the test circuit further includes:
an OR gate configured to receive an observation disable signal and the SEN signal and accordingly output the selection signal, wherein in the debug circuit test mode the selection signal is determined according to the SEN signal while a value of the observation disable signal is equal to the second signal value of the SEN signal, and in a normal test mode the selection signal is determined according to the observation disable signal while the value of the observation disable signal is equal to the first signal value of the SEN signal.

6. The test device of claim 5, wherein the $K^{th}$ observation clock is one of a phase-locked loop (PLL) clock and a reference clock; in the normal test mode, the CUT(s) include(s) the OR gate and the $K^{th}$ clock switch, and when a value of the $K^{th}$ output signal of the $K^{th}$ flip-flop is the second input value, the value of the $K^{th}$ output signal indicates the $K^{th}$ flip-flop is triggered to store the second input signal and thereby shows the CUT(s) function(s) abnormally.

7. The test device of claim 1, further comprising the on-chip clock controller, wherein the on-chip clock controller includes N OCC(s) from a first OCC to an $N^{th}$ OCC in sequence, the N OCC(s) is/are coupled with the N selective circuit(s) respectively and include(s) the $K^{th}$ OCC, and each of the N OCC(s) is a target OCC including:
at least one multiplexer configured to output a reference clock or one of a phase-locked loop (PLL) clock and a divisional clock of the PLL clock as an observation clock, wherein the observation clock is outputted to one of the N selective circuit(s) corresponding to the target OCC.

8. The test device of claim 7, wherein the at least one multiplexer is a single multiplexer configured to output one of the reference clock and the PLL clock as the observation clock.

9. The test device of claim 7, wherein the at least one multiplexer includes:
a first multiplexer configured to output one of the reference clock and the PLL clock as a selection clock; and
a second multiplexer configured to output one of the selection clock and the divisional clock as the observation clock.

10. A test device for testing an on-chip clock controller, the test device comprising:
a scan chain including N flip-flop circuit(s), wherein the N is a positive integer, each of the N flip-flop circuit(s) is a target flip-flop circuit, and each target flip-flop circuit is configured to:
store a first input signal as a storage signal first, then store a second input signal as the storage signal according to an input clock or keep the first input signal as the storage signal according to the input clock, and then output the storage signal;
wherein:
a value of the first input signal is different from a value of the second input signal; and
a value of the storage signal indicates whether the target flip-flop circuit stores the second input signal according to the input clock under test setting and thereby shows whether circuit(s) under test (CUT(s)) for transmission of the input clock function(s) normally; and
a test circuit including N selective circuit(s), wherein:
each of the N selective circuit(s) corresponds to a respective flip-flop circuit of the N flip-flop circuit(s) of the scan chain;
each of the N selective circuit(s) is a target selective circuit configured to:
output one of an observation clock and an independent clock as the input clock according to the test setting, and thereby output the input clock to the respective flip-flop circuit corresponding to the target selective circuit; and
the observation clock is from the on-chip clock controller.

* * * * *